(12) United States Patent
Kallmark et al.

(10) Patent No.: US 12,114,467 B2
(45) Date of Patent: Oct. 8, 2024

(54) HEATSINK WITH INCREASED AIR FLOW

(71) Applicant: HUAWEI TECHNOLOGIES CO., LTD., Shenzhen (CN)

(72) Inventors: Magnus Kallmark, Kista (SE); Fredrik Ohlsson, Kista (SE); Vadim Tsoi, Kista (SE); Reine Granstrom, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 156 days.

(21) Appl. No.: 17/871,660

(22) Filed: Jul. 22, 2022

(65) Prior Publication Data
US 2022/0361372 A1    Nov. 10, 2022

Related U.S. Application Data

(63) Continuation of application No. PCT/EP2020/051807, filed on Jan. 24, 2020.

(51) Int. Cl.
*H05K 7/20* (2006.01)
*H01L 23/367* (2006.01)
*H01L 23/467* (2006.01)

(52) U.S. Cl.
CPC ..... *H05K 7/20409* (2013.01); *H01L 23/3672* (2013.01); *H01L 23/467* (2013.01);
(Continued)

(58) Field of Classification Search
CPC .......... H05K 7/20127; H05K 7/20154; H05K 7/20163; H05K 7/20509; F28F 3/048;
(Continued)

(56) References Cited

U.S. PATENT DOCUMENTS

D284,076 S  *  6/1986  Moeller ..................... D13/184
D292,914 S  *  11/1987  Moeller ..................... D13/184
(Continued)

FOREIGN PATENT DOCUMENTS

CN      103187893 A  *  7/2013
CN      207652866 U  *  7/2018
(Continued)

OTHER PUBLICATIONS

Certified foreign priority document for WO-2021043047-A.*
(Continued)

*Primary Examiner* — Zachary Pape
(74) *Attorney, Agent, or Firm* — Leydig, Voit & Mayer, Ltd.

(57) ABSTRACT

The invention relates to a heatsink for transferring heat from one or more electrical devices to a heat transfer medium. The heatsink includes a plurality of fins arranged on a frontside of the heatsink. The plurality of fins includes a first group of fins extending in a first planar direction and a second group of fins extending in a second planar direction angled in relation to the first planar direction. For example, the first group of fins may extend from the bottom to the top of the heatsink, while the second group of fins may extend from the first group of fins to the sides of the heatsink. In this way, the sides of the heatsink can be used as air outlets and the airflow through the heatsink can be increased.

18 Claims, 9 Drawing Sheets

(52) U.S. Cl.
CPC ...... *F28F 2215/04* (2013.01); *H05K 7/20127* (2013.01); *H05K 7/20509* (2013.01)

(58) Field of Classification Search
CPC ........ F28F 13/06; F28F 13/08; F28F 2215/02; H01L 23/367–3672
See application file for complete search history.

(56) References Cited

U.S. PATENT DOCUMENTS

| | | | |
|---|---|---|---|
| 7,096,678 B2 | 8/2006 | Petroski | |
| 2005/0150637 A1 | 7/2005 | Tan et al. | |
| 2009/0262505 A1 | 10/2009 | Lin | |
| 2017/0241721 A1 | 8/2017 | Liang | |
| 2021/0051815 A1* | 2/2021 | Van Wyk | H01L 23/467 |
| 2021/0400837 A1* | 12/2021 | Skoglund | H05K 7/2039 |

FOREIGN PATENT DOCUMENTS

| | | | | |
|---|---|---|---|---|
| CN | 209710561 U | * | 11/2019 | |
| DE | 202018101375 U1 | * | 7/2018 | .............. F21V 29/74 |
| TW | M528417 U | * | 9/2016 | |
| WO | 2010025596 A1 | | 3/2010 | |
| WO | 2015022032 A1 | | 2/2015 | |
| WO | WO-2018054462 A1 | * | 3/2018 | .............. F28F 13/06 |
| WO | WO-2021043047 A1 | * | 3/2021 | ......... H05K 7/20409 |

OTHER PUBLICATIONS

Hagote et al., "Study of Natural Convection Heat Transfer on Horizontal, Inclined and Vertical Heated Plate by V-Fin Array," International Journal of Scientific & Engineering Research, vol. 5, Issue 6, Total 13 pages (Jun. 2014).

* cited by examiner

HEATSINK WITH INCREASED AIR FLOW

CROSS-REFERENCE TO RELATED APPLICATIONS

This application is a continuation of International Application No. PCT/EP2020/051807, filed on Jan. 24, 2020, the disclosure of which is hereby incorporated by reference in its entirety.

TECHNICAL FIELD

The invention relates to a heatsink attachable or attached to one or more electrical devices for transferring heat from the one or more electrical devices to a heat transfer medium. The invention further relates to a cooling device comprising such a heatsink.

BACKGROUND

Heatsinks for natural convection cooling (NCC) provide cooling of electrical devices or components with an air flow through the heatsink. The air flow is guided through the heatsink by a plurality of fins. Designing heatsinks for NCC includes the optimization of air inlets, air outlets, and fins.

SUMMARY

An objective of embodiments of the invention is to provide a solution which mitigates or solves the drawbacks and problems of conventional solutions.

The above and further objectives are solved by the subject matter of the independent claims. Further advantageous embodiments of the invention can be found in the dependent claims.

According to a first aspect of the invention, the above mentioned and other objectives are achieved with a heatsink attachable or attached to one or more electrical devices for transferring heat from the one or more electrical devices to a heat transfer medium, the heatsink comprising a plurality of fins arranged on a frontside of the heatsink, wherein the plurality of fins comprises a first group of fins and a second group of fins, wherein the fins in the first group of fins extend in a first planar direction of the frontside; and the fins in the second group of fins extend in a second planar direction of the frontside, wherein the second planar direction is angled in relation to the first planar direction.

The heat transfer medium may be any fluid suitable for transferring heat. The heat transfer medium may e.g. be air but is not limited thereto.

An advantage of the heatsink according to the first aspect is that the plurality of fins can be arranged in a flexible way, allowing air inlets and air outlets of the heatsink to be optimized to increase and control the air flow through the heatsink. The heatsink can thereby provide an improved heat transfer.

The frontside is generally planar and thus defines a plane. A planar direction is a direction that is parallel to that plane, i.e. a direction that is orthogonal to a normal direction of the plane. In other words, the fins of the first group extend in a first direction (the first planar direction), which is parallel to the plane defined by the frontside. The fins of the second group extend in a second direction (the second planar direction), which is parallel to the plane defined by the frontside.

In an implementation form of a heatsink according to the first aspect, the first group of fins are arranged along a line of the frontside extending from a top end of the heatsink to a bottom end of the heatsink, and the second group of fins extend towards sides of the heatsink.

An advantage with this implementation form is that the sides of the heatsink are opened up to air flow such that the sides can be used as air inlets or air outlets. Furthermore, the air intake from the front of the heatsink can be increased in the area between the first group of fins and the second group of fins. Thereby, increasing the air flow through the heatsink and improving the distribution of the air flow over the heatsink such that the heat transfer provided by the heatsink can be improved.

In an implementation form of a heatsink according to the first aspect, the second group of fins comprises a first subgroup of fins and a second subgroup of fins, wherein
the fins in the first subgroup of fins extend from the first group of fins towards a first side of the heatsink, and
the fins in the second subgroup of fins extend from the first group of fins towards a second side of the heatsink arranged opposite to the first side.

An advantage with this implementation form is that both sides of the heatsink can be used as air inlets or air outlets, providing further flexibility in the design of the fins, while keeping the design of the fins simple.

In an implementation form of a heatsink according to the first aspect, the first subgroup of fins and the second subgroup of fins include the same number of fins.

An advantage with this implementation form is that the design of the fins is kept simple and easy to manufacture.

In an implementation form of a heatsink according to the first aspect, one or more fins in the first subgroup of fins extend from and is aligned with one or more corresponding fins in the second subgroup of fins.

An advantage with this implementation form is that the air intake from the bottom of the heatsink can be at least partly blocked such that the intake of cold air from the front of the heatsink can be increased and provided to specific areas of the heat sink. Thereby, providing an improved distribution of the air flow in the heatsink.

In an implementation form of a heatsink according to the first aspect, the first group of fins comprises a third subgroup of fins partially extending from the top end to the bottom end, or vice versa.

An advantage with this implementation form is that it provides further flexibility in the design of the fins, allowing the air inlets and air outlets to be further optimized to increase and control the air flow through the heatsink.

In an implementation form of a heatsink according to the first aspect, a length of a fin in the third subgroup of fins is dependent on a distance to a side of the heatsink.

An advantage with this implementation form is that it provides further flexibility in the design of the fins, allowing the air inlets and air outlets to be further optimized to increase and control the air flow through the heatsink.

In an implementation form of a heatsink according to the first aspect, the length increases or decreases depending on the distance to the side of the heatsink.

An advantage with this implementation form is that it provides further flexibility in the design of the fins, allowing the air inlets and air outlets to be further optimized to increase and control the air flow through the heatsink.

In an implementation form of a heatsink according to the first aspect, one or more fins in the first group of fins are aligned with one or more corresponding fins in the second group of fins.

An advantage with this implementation form is that the air flow between fins in the first group of fins and fins in the second group of fins is mainly uninterrupted, i.e. not blocked. Thereby, providing an increase air flow through the heatsink.

In an implementation form of a heatsink according to the first aspect, the one or more fins in the first group of fins and the one or more corresponding fins in the second group of fins are formed as common fins.

An advantage with this implementation form is that heat can be conducted between the first group of fins and the second group of fins in the common fins. Thereby, allowing heat to be transferred between the first group of fins and the second group of fins.

In an implementation form of a heatsink according to the first aspect, there is a gap between the one or more fins in the first group of fins and the one or more corresponding fins in the second group of fins.

An advantage with this implementation form is that heat cannot be conducted between the first group of fins and the second group of fins. Thereby, avoiding that heat is transferred between the first group of fins and the second group of fins.

In an implementation form of a heatsink according to the first aspect, one or more fins in the first group of fins are non-aligned with one or more corresponding fins in the second group of fins.

An advantage with this implementation form is that the boundary layer is broken and hence a higher heat flux from the fin to the air is achieved for the second group of fins.

In an implementation form of a heatsink according to the first aspect, the first group of fins comprises a fourth subgroup of fins fully extending from the top end to the bottom end, or vice versa.

An advantage with this implementation form is that the air intake from the front of the heatsink can be increased in the area between the first group of fins and the second group of fins.

In an implementation form of a heatsink according to the first aspect, the second planar direction is angled in relation to the first planar direction with an angle having a value between 0 to 90 degrees.

In an implementation form of a heatsink according to the first aspect, the angle has a value between 30 to 45 degrees.

An advantage with these implementation forms is that the air inlets or air outlets of the second group of fins can be optimized relative to the first group of fins, thereby increasing the air flow through the heatsink.

According to a second aspect of the invention, the above mentioned and other objectives are achieved with cooling device comprising a heatsink according to any of the implementation forms of a heatsink according to the first aspect, and one or more electrical devices attached at a backside of the heatsink.

An advantage of the cooling device according to the second aspect are the same as those for the corresponding implementation forms of the heatsink according to the first aspect. Furthermore, as the heatsink according to the first aspect provides an improved heat transfer, the cooling device according to the second aspect can provide an improved cooling of the one or more electrical devices.

In an implementation form of a cooling device according to the second aspect, the second planar direction is angled in relation to the first planar direction in an area of the frontside opposite to an area of the backside where the one or more electrical devices are attached to the backside.

An advantage with this implementation form is that the air intake from the front of the heatsink can be increased in the area where the one or more electrical devices are located and hence an improved heat transfer can be provided in this area. Thereby, electrical devices which are sensitive to high temperatures can be protected from overheating.

Further applications and advantages of the embodiments of the invention will be apparent from the following detailed description.

BRIEF DESCRIPTION OF THE DRAWINGS

The appended drawings are intended to clarify and explain different embodiments of the invention, in which.

DETAILED DESCRIPTION

Figure 1A:
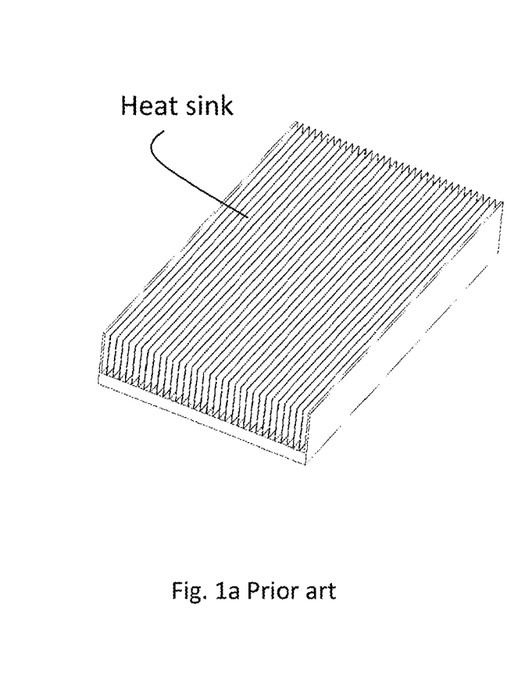
FIGS. 1a-c show a prior art heatsink.
Figure 1B:
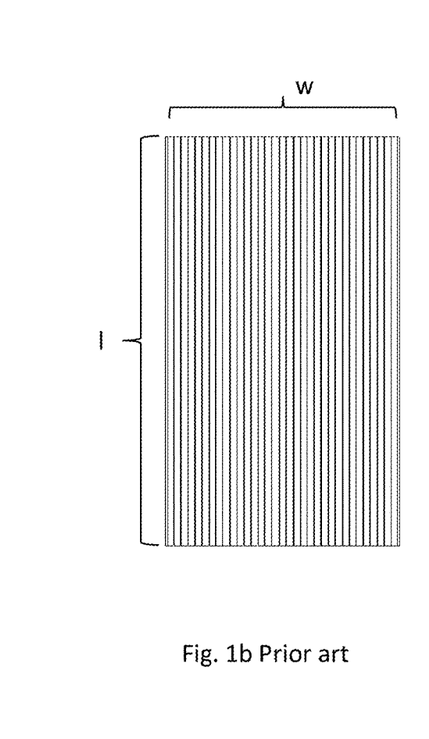
Figure 1C:
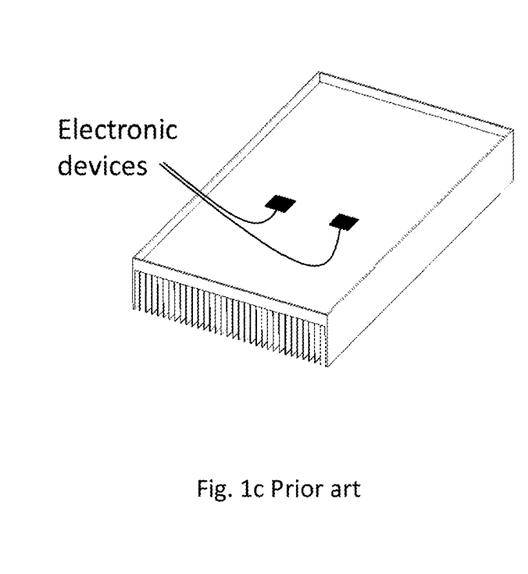

In some conventional heatsinks for NCC, the fins are designed to optimize air intake from the bottom of the heatsink and to utilize the top of the heatsink as an air outlet. The fins of a conventional heatsink for NCC are hence typically straight and extend from the bottom to the top of the heatsink. FIGS. 1a-c show a conventional heatsink where the fins extend along the length 1 of the heatsink. The fins are arranged on a front side of the heatsink, as shown in FIGS. 1a-b. Electronic devices to be cooled by the heatsink are arranged on a backside of the heatsink, as shown in FIG. 1c. The electronic devices may e.g. be attached to a printed circuit board (PCB) which in turn is attached or in contact with the heatsink.

For a heatsink that is rectangular and tall, meaning that the length 1 is substantially larger than the width w, a higher airflow will enter the heatsink from the front than from the bottom. The inventors when studying conventional heatsinks have concluded that conventional heatsinks does not utilize the air available from the front of the heatsink and are hence not optimized for rectangular and tall heatsinks. To maximize the potential of using the air available at the front of the heatsink, there need to be a balance between air inlets and air outlets. If both the bottom and the front of the heatsink is being used as air inlets, the top of the heatsink as an air outlet is not enough. Therefore, further air outlets need to be provided in the heatsink.

An objective of the invention is therefore to improve the design of the fins of a heatsink to optimize air inlets and air outlets such that the airflow through the heatsink can be improved. In this respect a design is provided where e.g. the sides of the heatsink can be opened up and used as air outlets.

Figure 2A:
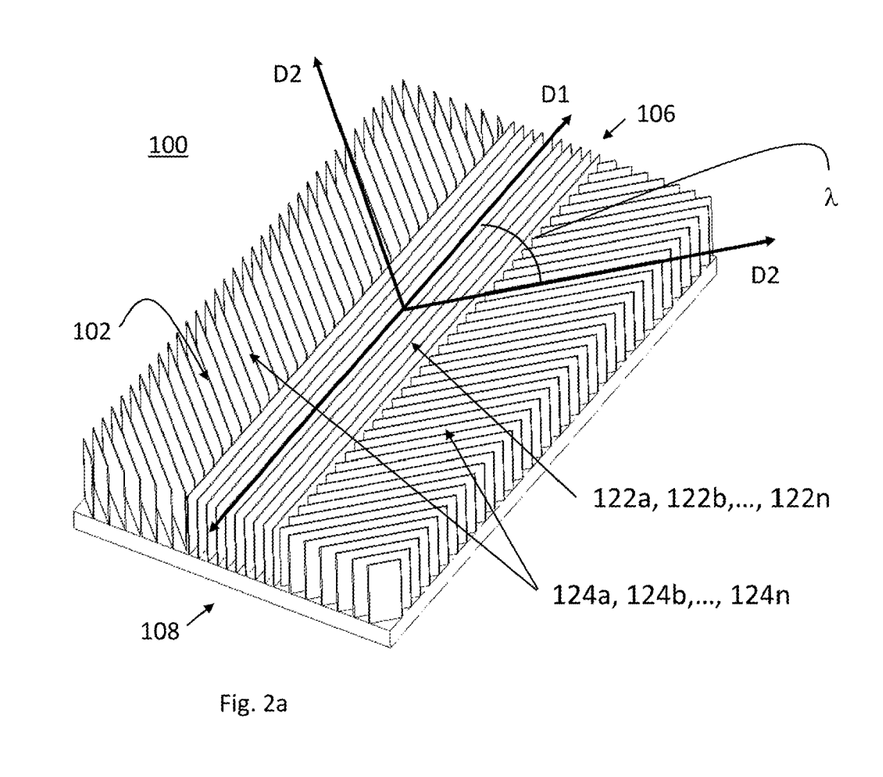
FIGS. 2a-b show a heat sink according to an embodiment of the invention.
Figure 2B:
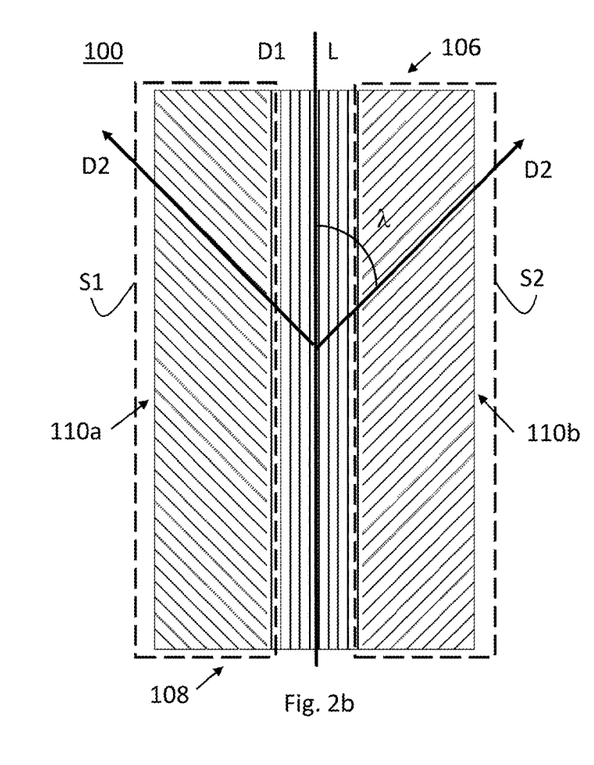

FIGS. 2a-b shows a heatsink 100 for transferring heat from one or more electrical devices to a heat transfer medium according to an embodiment of the invention. The heat transfer medium may be air but is not limited thereto. The heatsink 100 is attachable or attached to the one or more electrical devices (not shown in FIGS. 2a-b). The heatsink 100 comprises a plurality of fins arranged on a frontside 102 of the heatsink 100. The frontside 102 of the heatsink 100 may be planar and thus defines a plane with a surface upon which the plurality of fins is arranged. In a conventional way, the plurality of fins may be attached or formed integral with the frontside 102 of the heat sink 100. Furthermore, each fin of the plurality of fins may in non-limiting embodiments be arranged essentially perpendicular to the plane of the frontside 102, i.e. have an extension in a direction which is essentially perpendicular to the plane of the frontside 102. The extension of each fin in the direction essentially perpendicular to the plane of the frontside 102 can be seen as the height of fin.

The plurality of fins comprises a first group of fins 122a, 122b, . . . , 122n and a second group of fins 124a, 124b, . . . , 124n. The fins in the first group of fins 122a, 122b, . . . , 122n extend in a first planar direction D1 of the frontside 102. The first planar direction D1 is a direction in the plane of the frontside 102. Thus, the fins in the first group of fins 122a, 122b, . . . , 122n has an extension in the first planar direction D1 along the plane defined by the frontside 102. The fins in the second group of fins 124a, 124b, . . . , 124n extend in a second planar direction D2 of the frontside 102. The second planar direction D2 is also a direction in the plane of the frontside 102. Thus, the fins in the second group of fins 124a, 124b, . . . , 124n has an extension in the second planar direction D2 along the plane defined by the frontside 102. The second planar direction D2 is angled in relation to the first planar direction D1, as shown in FIGS. 2a-b.

According to embodiments of the invention the second planar direction D2 is angled in relation to the first planar direction D1 with an angle λ having a value between 0 to 90 degrees. The angle λ may further in embodiments have a value between 30 to 45 degrees. In the embodiment shown in FIGS. 2a-b, the angle λ between the first planar direction D1 and the second planar direction D2 has a value of approximately 45 degrees.

The distance between the fins, sometimes referred to as the pitch, may be different or the same both within one group of fins and between groups of fins. For example, the distance between the fins in the first group of fins 122a, 122b, . . . , 122n may be different or the same as the distance between the fins in the second group of fins 124a, 124b, . . . , 124n.

With reference to FIG. 2b, the first group of fins 122a, 122b, . . . , 122n may be arranged along a line L of the frontside 102 extending from a top end 106 of the heatsink 100 to a bottom end 108 of the heatsink 100. Furthermore, the second group of fins 124a, 124b, . . . , 124n may extend towards sides 110a, 110b of the heatsink 100.

Furthermore, the second group of fins 124a, 124b, . . . , 124n may comprise a first subgroup of fins S1 and a second subgroup of fins S2. The fins in the first subgroup of fins S1 extend from the first group of fins 122a, 122b, . . . , 122n towards a first side 110a of the heatsink 100 and the fins in the second subgroup of fins S2 extend from the first group of fins 122a, 122b, . . . , 122n towards a second side 110b of the heatsink 100 arranged opposite to the first side 110a.

Thus, the first group of fins 122a, 122b, . . . , 122n may in some embodiments be arranged between the first subgroup of fins S1 and the second subgroup of fins S2 comprised in the second group of fins 124a, 124b, . . . , 124n, as shown in FIG. 2b. The first subgroup of fins S1 and the second subgroup of fins S2 may include the same number of fins. However, the first subgroup of fins S1 and the second subgroup of fins S2 may in some embodiments instead include different number of fins without deviating from the scope of the invention.

In the embodiment shown in FIGS. 2a-b, all the fins in the first group of fins 122a, 122b, . . . , 122n fully extend from the top end 106 to the bottom end 108 of the heatsink 100. However, the first group of fins 122a, 122b, . . . , 122n may comprise a subgroup of fins which only partially extends from the top end 106 to the bottom end 108 of the heat sink 100, or vice versa. For example, the first group of fins 122a, 122b, . . . , 122n may comprise a third subgroup of fins partially extending from the top end 106 to the bottom end 108, or vice versa. A length of a fin in the third subgroup of fins may dependent on a distance to a side 110a, 110b of the heatsink 100. For example, the length may increase or decrease depending on the distance to the side 110a, 110b of the heatsink 100.

Figure 3A:
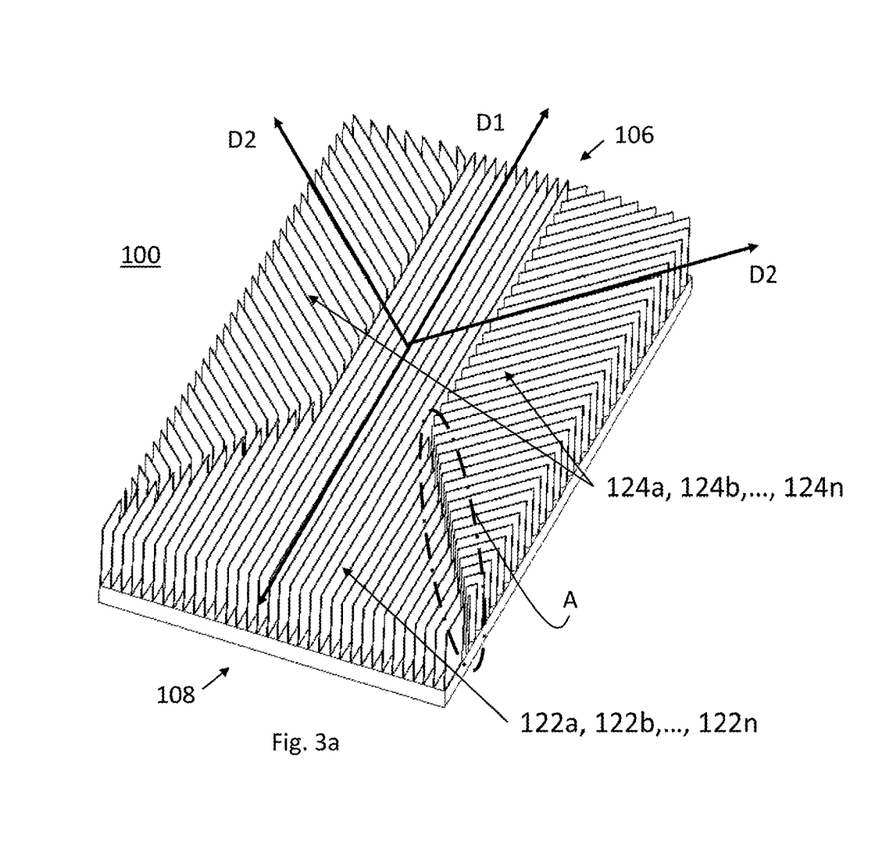
FIGS. 3a-b show a heat sink according to an embodiment of the invention.
Figure 3B:
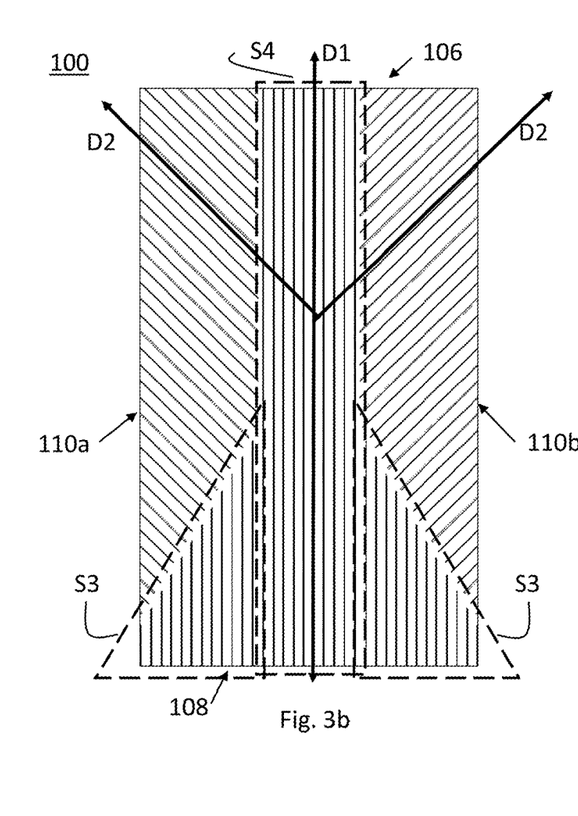

FIGS. 3a-b shows a heatsink 100 according to an embodiment where the first group of fins 122a, 122b, . . . , 122n comprises a third subgroup of fins S3. In the embodiment shown in FIGS. 3a-b, the fins in the third subgroup of fins S3 partially extend from the bottom end 108 of the heatsink 100, while the rest of the fins in the first group of fins 122a, 122b, . . . , 122n fully extend from the bottom end 108 to the top end 106 of the heatsink 100. The length of the fins in the third subgroup of fins S3 depends on the distance to the side 110a; 110b of the heatsink 100 such that the length of the fins in the third subgroup of fins S3 decreases when the distance to the side 110a; 110b of the heatsink 100 decreases.

In the embodiment shown in FIGS. 3a-b, the first group of fins 122a, 122b, . . . , 122n further comprises a fourth subgroup of fins S4 fully extending from the top end 106 to the bottom end 108, or vice versa. The third subgroup of fins S3 is arranged on both sides of the fourth subgroup of fins S4, i.e. both towards the first side 110a and the second side 110b of the heatsink 100. Thus, the length of some fins in the third subgroup of fins S3 decreases when the distance to the first side 110a of the heatsink 100 decreases, while the length of some fins in the third subgroup of fins S3 decreases when the distance to the second side 110b of the heatsink 100 decreases.

In some areas on the frontside 102 of the heatsink 100, one or more fins from the first group of fins 122a, 122b, . . . , 122n may meet one or more fins in the second group of fins 124a, 124b, . . . , 124n due to the different extension directions of the first group of fins 122a, 122b, . . . , 122n and the second group of fins 124a, 124b, . . . , 124n. Further details related to such areas will now be described with reference to FIGS. 4a-c. The area may e.g. correspond to the area A indicated in FIG. 3a.

Figure 4A:
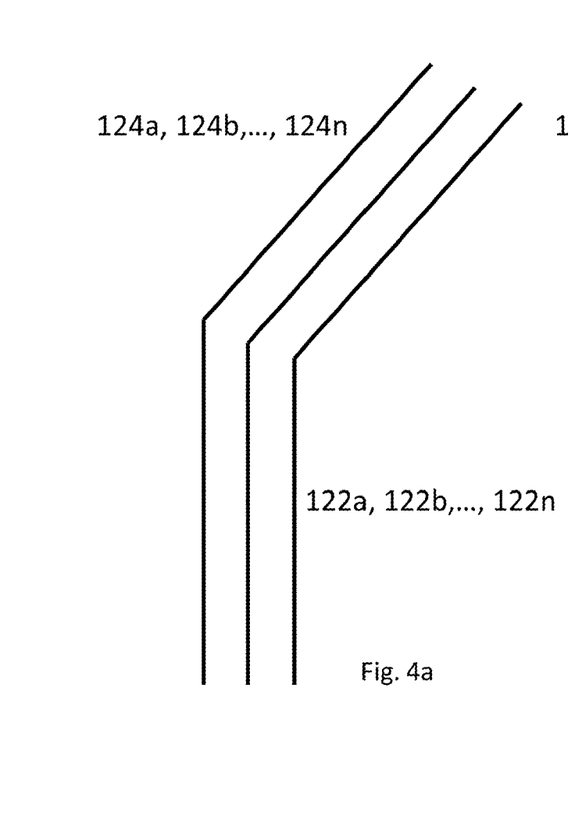
FIGS. 4a-c show a first group of fins and a second group of fins according to an embodiment of the invention
Figure 4B:
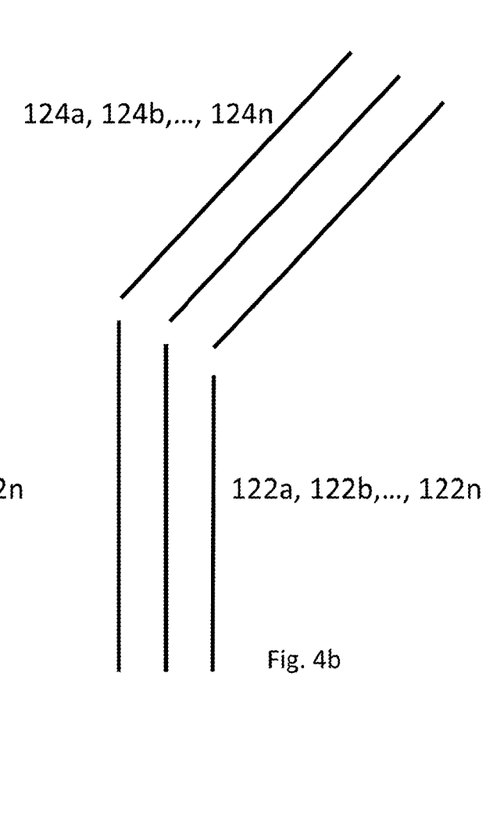
Figure 4C:
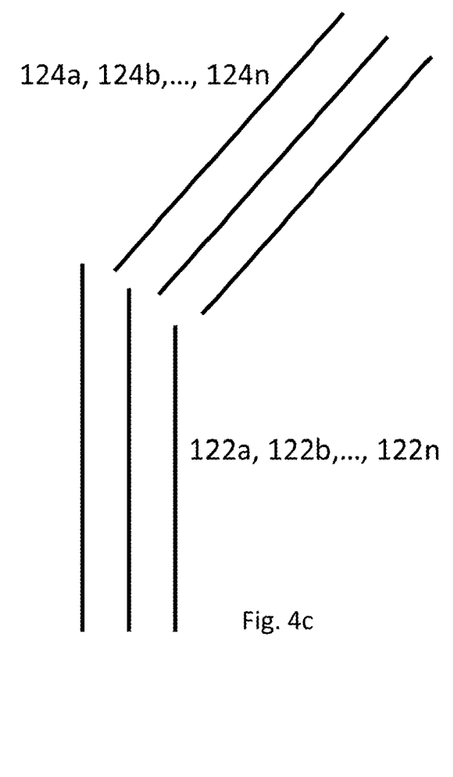

FIGS. 4a-c shows transitions from one or more fins in the first group of fins 122a, 122b, . . . , 122n to one or more corresponding fins in the second group of fins 124a, 124b, . . . , 124n according to different embodiments. In FIG. 4a, the one or more fins in the first group of fins 122a, 122b, . . . , 122n are aligned with the one or more corresponding fins in the second group of fins 124a, 124b, . . . , 124n. Furthermore, the one or more fins in the first group of fins 122a, 122b, . . . , 122n and the one or more corresponding fins in the second group of fins 124a, 124b, . . . , 124n are formed as common fins, e.g. by folding or extrusion. The one or more fins in the first group of fins 122a, 122b, . . . , 122n and the one or more corresponding fins in the second group of fins 124a, 124b, . . . , 124n may e.g. be attached to each other or be formed integral with each other. Thus, there is no gap between the one or more fins in the first group of fins 122a, 122b, ..., 122n and the one or more corresponding fins in the second group of fins 124a, 124b, ..., 124n. The common fins can conduct heat and hence allows heat to be transferred between the first group of fins 122a, 122b, ..., 122n and the second group of fins 124a, 124b, ..., 124n.

FIG. 4b shows an embodiment where the one or more fins in the first group of fins 122a, 122b, ..., 122n are still aligned with the one or more corresponding fins in the second group of fins 124a, 124b, ..., 124n but where there is a gap between the one or more fins in the first group of fins 122a, 122b, ..., 122n and the one or more corresponding fins in the second group of fins 124a, 124b, ..., 124n. In this embodiment, heat transfer between the first group of fins 122a, 122b, ..., 122n and the second group of fins 124a, 124b, ..., 124n can be avoided.

In the embodiment shown in FIG. 4c, the one or more fins in the first group of fins 122a, 122b, ..., 122n are non-aligned with the one or more corresponding fins in the second group of fins 124a, 124b, ..., 124n. Thus, there is a gap between the one or more fins in the first group of fins 122a, 122b, ..., 122n and the one or more corresponding fins in the second group of fins 124a, 124b, ..., 124n. With non-aligned fins the boundary layer is broken and hence a higher heat flux from the fins to the air can be achieved.

Figure 5A:
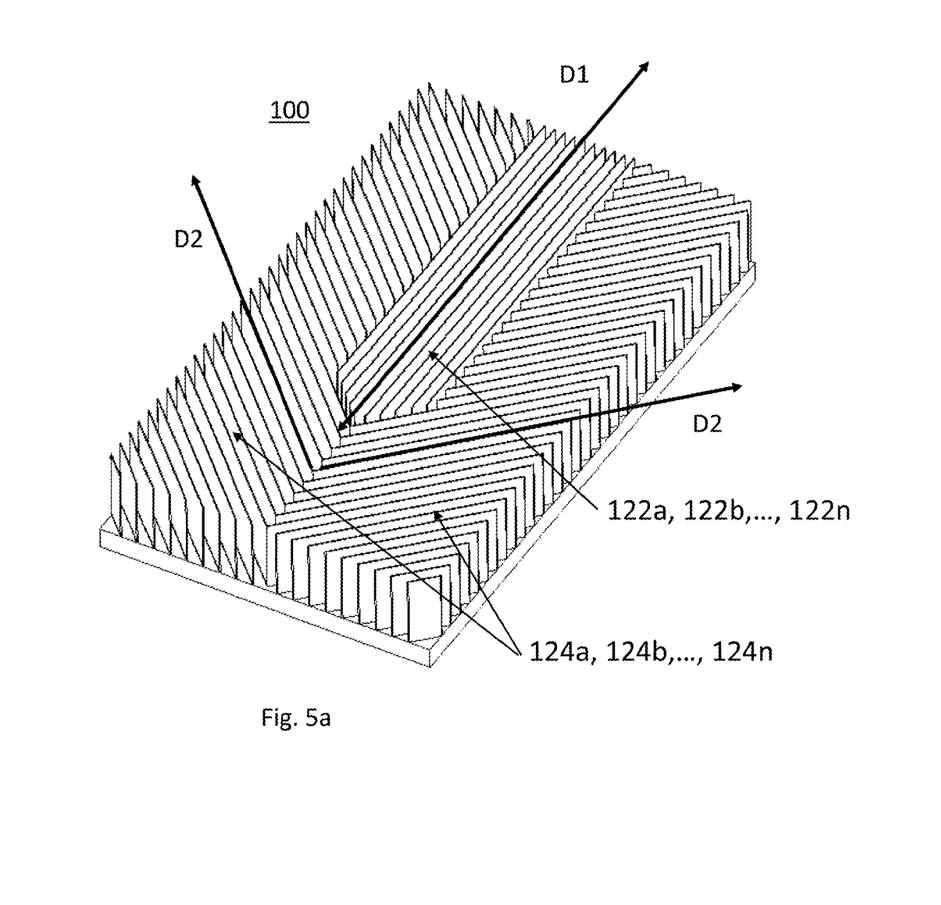
FIGS. 5a-b show a heat sink according to an embodiment of the invention.
Figure 5B:
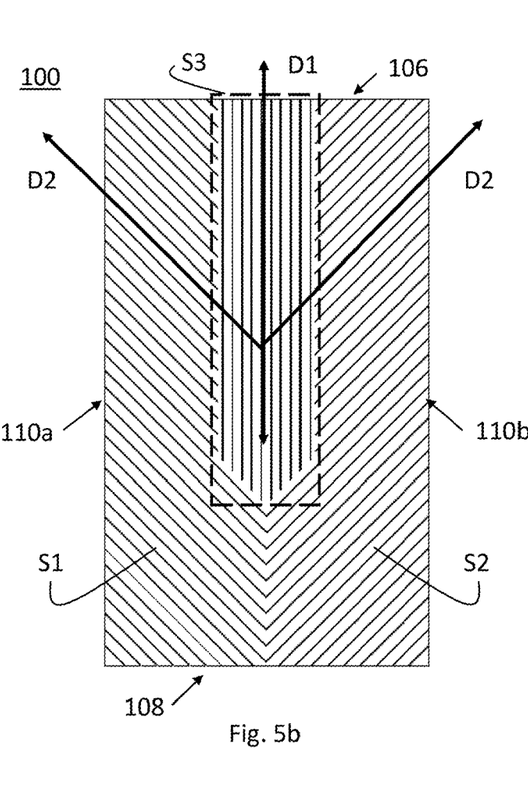

FIGS. 5a-b show a heatsink 100 according to embodiments where the first group of fins 122a, 122b, ..., 122n comprises a third subgroup of fins S3 and the second group of fins 124a, 124b, ..., 124n comprises a first subgroup of fins S1 and a second subgroup of fins S2. In the embodiment shown in FIGS. 5a-b, the fins in the third subgroup of fins S3 partially extends from the top end 106 of the heatsink 100. The first group of fins 122a, 122b, ..., 122n does not comprise any fourth subgroup of fins S4 fully extending from the top end 106 to the bottom end 108 of the heat sink 100. This means that some fins in the first subgroup of fins S1 partly extend from the first group of fins 122a, 122b, ..., 122n towards the first side 110a of the heatsink 100, while some fins in the first subgroup of fins S1 partly extend from the second subgroup of fins S2 towards the first side 110a of the heatsink 100. In a similar way, some fins in the second subgroup of fins S2 partly extend from the first group of fins 122a, 122b, ..., 122n towards the second side 110b of the heatsink 100, while some fins in the second subgroup of fins S2 partly extend from the first subgroup of fins S1 towards the second side 110b of the heatsink 100. Thus, one or more fins in the first subgroup of fins S1 may in some embodiments extend from and may be aligned with one or more corresponding fins in the second subgroup of fins S2.

Figure 6A:
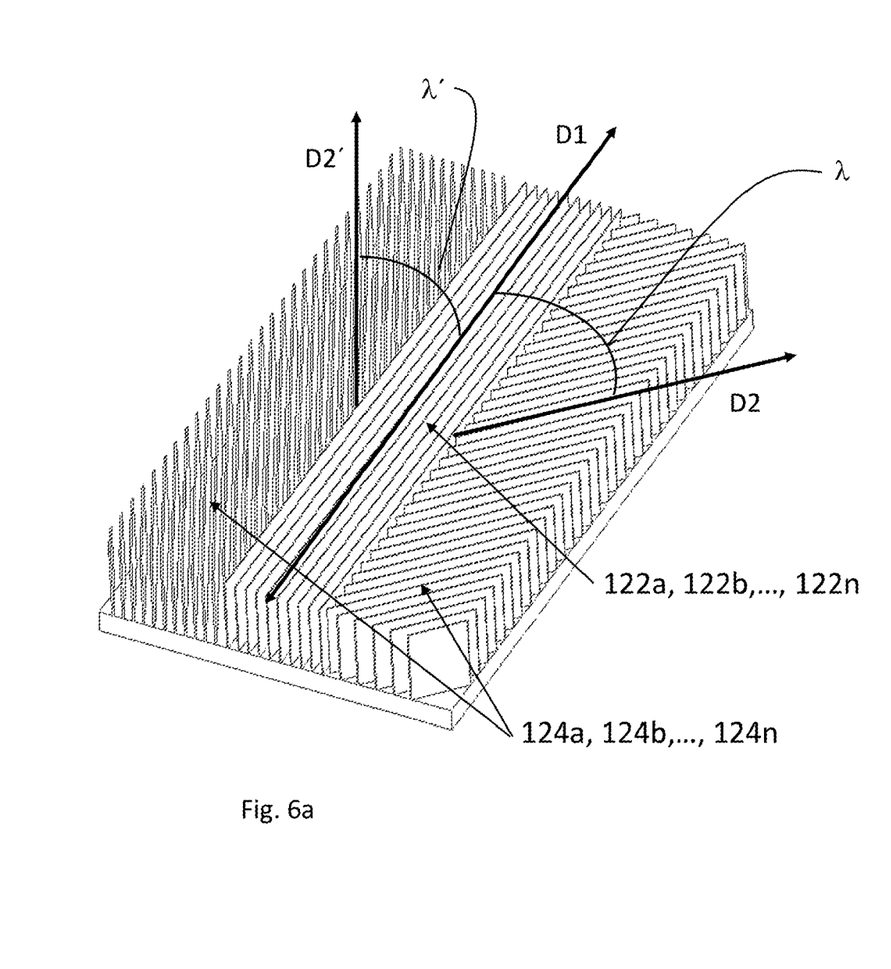
FIGS. 6a-b show a heat sink according to an embodiment of the invention.
Figure 6B:
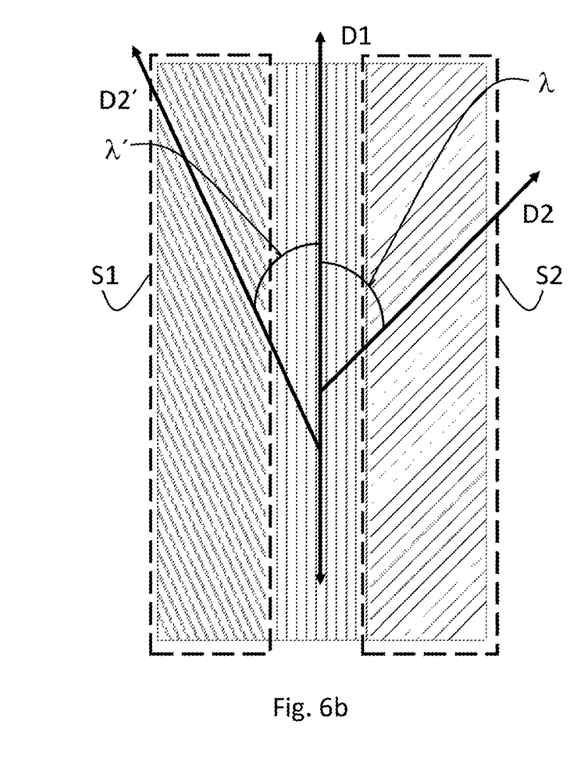

In the above described embodiments of the invention both the first subgroup of fins S1 and the second subgroup of fins S2 in the second group of fins 124a, 124b, ..., 124n extend in the second planar direction D2 with the same value of the angle $\lambda$ in relation to the first planar direction D1. However, the first subgroup of fins S1 and the second subgroup of fins S2 in the second group of fins 124a, 124b, ..., 124n may in embodiments be arranged with different angles in relation to the first planar direction D1. FIGS. 6a-b show a heatsink 100 according to such an embodiment. With reference to FIGS. 6a-b, the fins in the second subgroup of fins S2 extends in the second planar direction D2, while the first subgroup of fins S1 extends in another second planar direction D2'. The second planar direction D2 is angled in relation to the first planar direction D1 with the angle $\lambda$ and the other second planar direction D2' is angled in relation to the first planar direction D1 with another angle $\lambda'$ different from the angle $\lambda$. Any of the angles $\lambda$, $\lambda'$ may have a value between 0 to 90 degrees. Any of the angles $\lambda$, $\lambda'$ may further in some embodiment have a value between 30 to 45 degrees.

Figure 7:
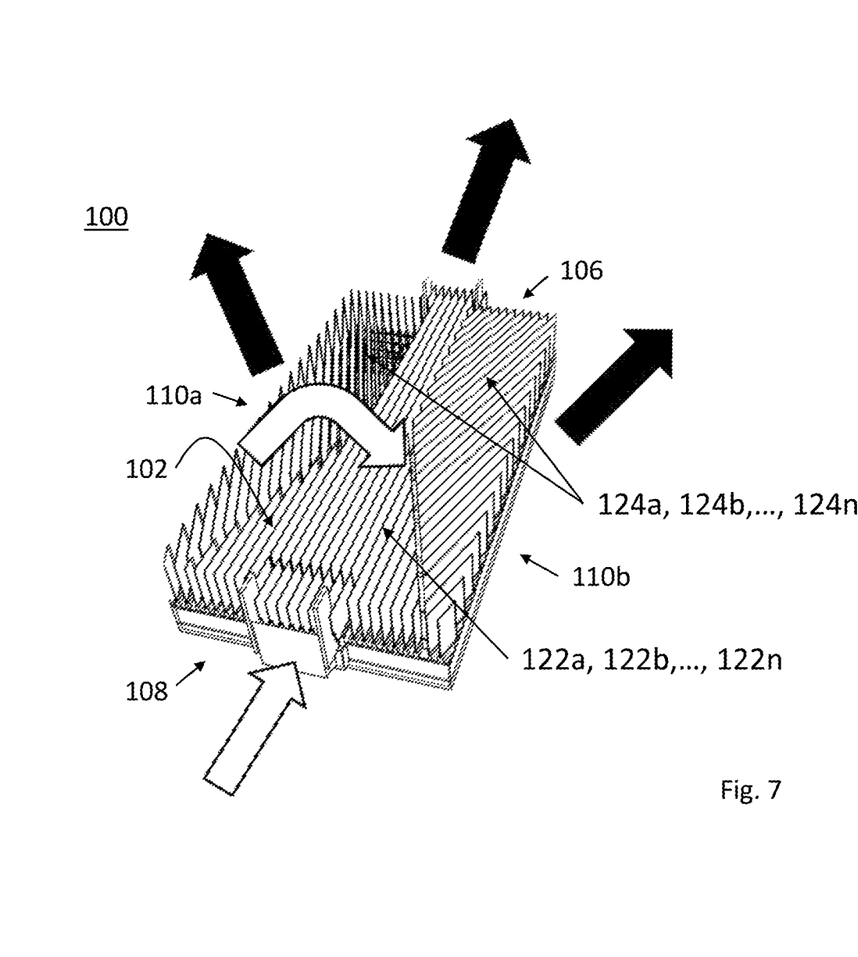
FIG. 7 shows air flow through a heatsink according to an embodiment of the invention.

FIG. 7 illustrates the airflow through a heatsink 100 according to an embodiment of the invention. The plurality of fins of the heatsink 100 shown in FIG. 7 are arranged as described above with reference to FIGS. 3a-b. Thus, the first group of fins 122a, 122b, ..., 122n are arranged such that air can enter the heatsink 100 from the front side 102 and the bottom end 108 of the heatsink 100, as indicated with white arrows in FIG. 7. Furthermore, the second group of fins 124a, 124b, ..., 124n are arranged such that air can exit the heatsink 100 from the tope end 106 and the sides 110a, 110b of the heatsink 100, as indicated with black arrows in FIG. 7. By opening the sides 110a, 110b of the heatsink 100 with the angled fins in the second group of fins 124a, 124b, ..., 124n, the air flow through the heatsink 100 can be increased and the heatsink 100 can provide improved heat transfer compared to conventional solutions.

The heatsink 100 may be manufactured in a number of different ways. In embodiments where the plurality of fins is integrated with the heatsink 100, the heatsink 100 may be manufactured using any one of: forging, casting, molding, machining, and 3D-printing. In embodiments where the plurality of fins is attached to a base of the heatsink 100, the base may be manufactured as described above and the plurality of fins may be manufactured using any one of: extruding, casting, forging, stamping, cutting, and molding. The plurality of fins may further be attached to the base using any one of: press fitting, brazing, gluing, soldering, and welding. The plurality of fins may e.g. be made of aluminum, copper, graphite, zinc or other thermally conductive materials.

Figure 8:
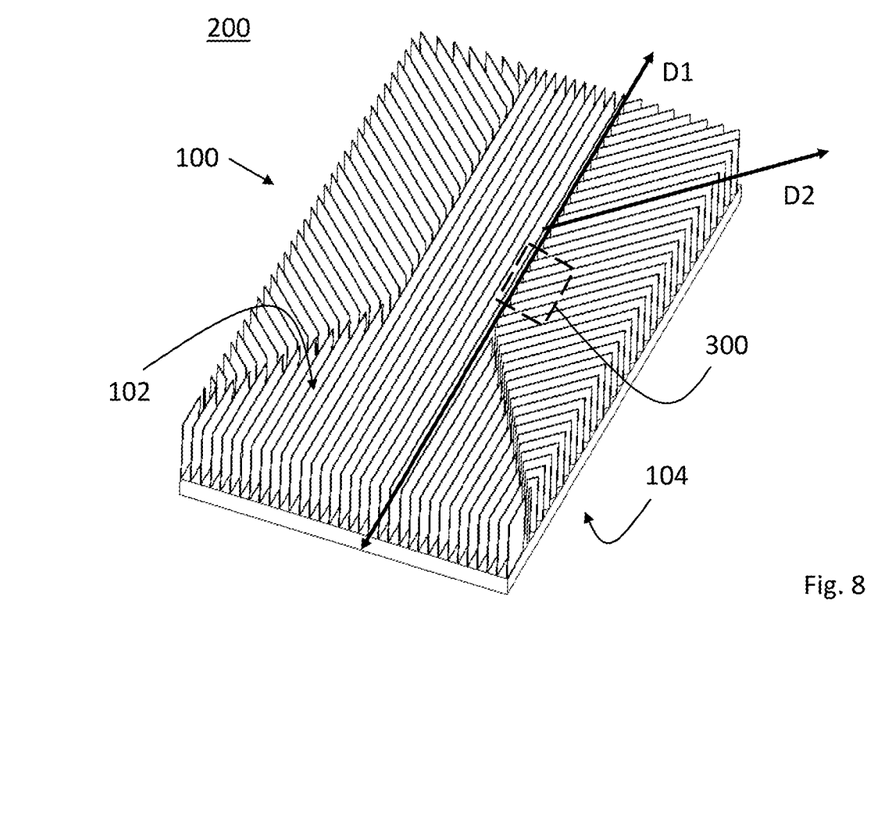
FIG. 8 shows a cooling device according to an embodiment of the invention.
Figure 9A:
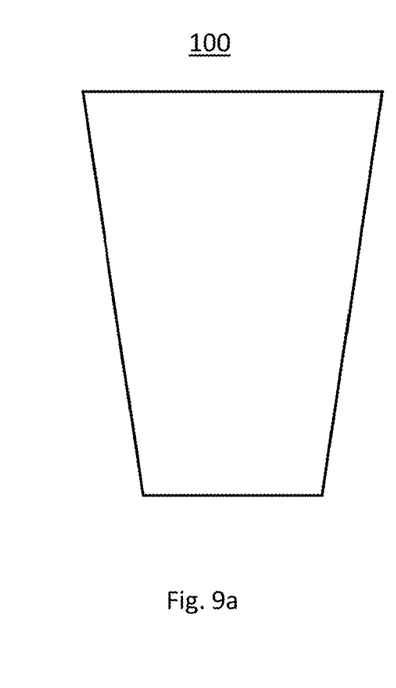
FIGS. 9a-d show shapes of a heat sink according to embodiments of the invention.
Figure 9B:
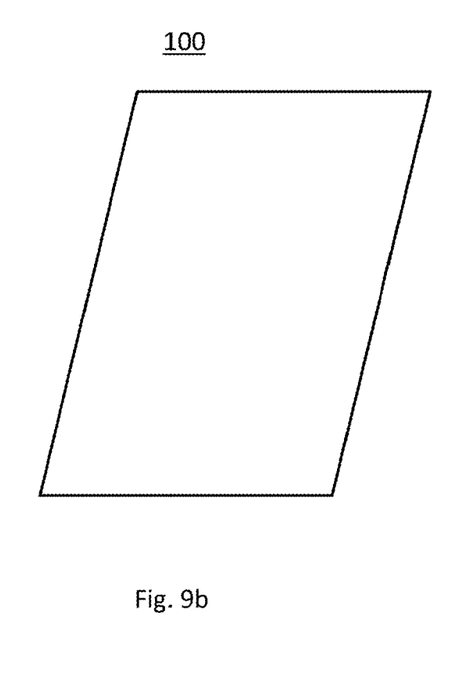
Figure 9C:
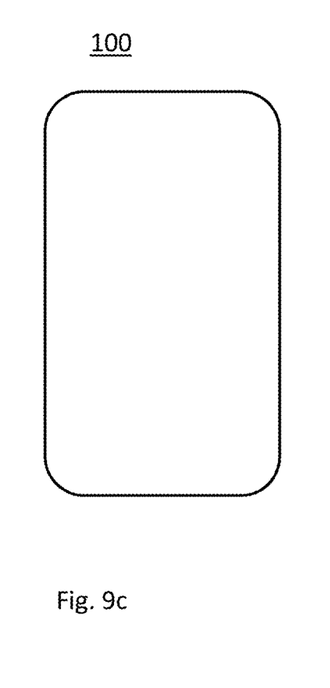
Figure 9D:
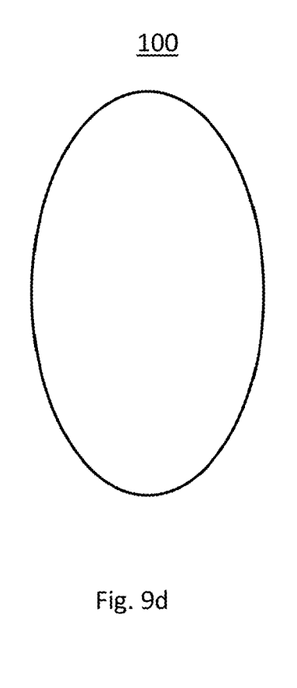

According to embodiments of the invention a cooling device 200 is also provided. The cooling device 200 comprises a heatsink 100 according to any embodiments of the invention and one or more electrical devices attached at a backside 104 of the heatsink 100. FIG. 8 shows such a cooling device 200 with one electrical device 300 attached at the backside 104 of the heatsink 100. The electrical device 300 may be attached to the backside 104 of the heatsink 100 in a conventional way, either directly or via a thermally conductive material. The electrical device 300 may further be attached to a printed circuit board attached or connected to the backside 104 of the heatsink 100. The plurality of fins of the heatsink 100 are arranged as described above with reference to FIGS. 3a-b. Thus, the first group of fins 122a, 122b, ..., 122n are arranged to extend in the first planar direction D1 and the second group of fins 124a, 124b, ..., 124n are arranged to extend in the second planar direction D2 angled in relation to the first planar direction D1. The second planar direction D2 is however angled in relation to the first planar direction D1 in an area of the frontside 102 opposite to an area of the backside 104 where the electrical device 300 are attached to the backside 104 as illustrated in FIG. 8. Thus, an increased air flow and hence improved heat transfer can be provided in the area where the electrical device 300 is located, i.e. the area with a high heat flux. The cooling device 100 can thereby provide an efficient cooling of the electrical device 300.

The heatsink 100 in the above described embodiments has a rectangular shape, i.e. the shape of the plane of the front side 102 of the heatsink 100 is essentially rectangular. However, the heatsink 100 may in embodiments have other shapes than a rectangular shape. FIGS. 9a-d show four examples of alternative shapes of the heatsink 100. The examples shown in FIGS. 9a-d are non-limiting and the heatsink 100 according to the invention may have other shapes without deviating from the scope of the invention.

Finally, it should be understood that the invention is not limited to the embodiments described above, but also relates to and incorporates all embodiments within the scope of the appended independent claims.

What is claimed is:

1. A heatsink attachable or attached to one or more electrical devices for transferring heat from the one or more electrical devices to a heat transfer medium, the heatsink comprising a plurality of fins arranged on a frontside of the heatsink,
   wherein the frontside is bordered by a top end, a bottom end, a first side edge and a second side edge;
   wherein the plurality of fins comprises:
      a first group of fins, and
      a second group of fins;
   wherein fins in the first group of fins extend in a first planar direction of the frontside; and,
   wherein fins in the second group of fins extend in at least a second planar direction of the frontside that is angled in relation to the first planar direction,
   wherein the second group of fins comprises:
      a first subgroup of fins that extend from the first group of fins to the first side edge and the top end, and
      a second subgroup of fins that extend from the first group of fins to the second side edge and the top end;
   wherein the first group of fins comprises fins extending from the top end to the bottom end and arranged on the frontside in a planar direction parallel to the first side edge and the second side edge,
   wherein the first group of fins further comprises a third subgroup of fins and a fourth subgroup of fins that are disposed on opposing sides of the fins extending from the top end to the bottom end,
      wherein the third subgroup and the fourth subgroup each includes at least one fin that runs along one of either the first side edge and the second side edge, and
   wherein the fins of the third subgroup of fins and fourth subgroup of fins only partially extend from the bottom end to an ending point before the top end.

2. The heatsink according to claim 1, wherein the first subgroup of fins and the second subgroup of fins have a same number of fins.

3. The heatsink according to claim 1, wherein a length of a fin in the third subgroup of fins is dependent on a distance to a side of the heatsink.

4. The heatsink according to claim 3, wherein the length increases or decreases depending on the distance to the side of the heatsink.

5. The heatsink according to claim 1, wherein an end of one or more fins in the first group of fins are is aligned with a corresponding one of one or more corresponding fins in the second group of fins.

6. The heatsink according to claim 5, wherein the one or more fins in the first group of fins and the one or more corresponding fins in the second group of fins are formed as common fins.

7. The heatsink according to claim 5, wherein there is a gap between the one or more fins in the first group of fins and the one or more corresponding fins in the second group of fins.

8. The heatsink according to claim 1, wherein one or more fins in the first group of fins are non-aligned with one or more corresponding fins in the second group of fins.

9. The heatsink according to claim 1, wherein the second planar direction is angled in relation to the first planar direction with an angle having a value within a range from 0 to 90 degrees.

10. A cooling device comprising:
   a heatsink attachable or attached to one or more electrical devices for transferring heat from the one or more electrical devices to a heat transfer medium, the heatsink comprising a plurality of fins arranged on a frontside of the heatsink,
      wherein the frontside is bordered by a top end, a bottom end, a first side edge and a second side edge;
      wherein the plurality of fins comprises:
         a first group of fins, and
         a second group of fins;
      wherein fins in the first group of fins extend in a first planar direction of the frontside,
      wherein fins in the second group of fins extend in at least a second planar direction of the frontside that is angled in relation to the first planar direction,
      wherein the second group of fins comprises:
         a first subgroup of fins that extend from the first group of fins to the first side edge and the top end, and
         a second subgroup of fins that extend from the first group of fins to the second side edge and the top end;
      wherein the first group of fins comprises fins extending from the top end to the bottom end and arranged on the frontside in a planar direction parallel to the first side edge and the second side edge,
      wherein the first group of fins further comprises a third subgroup of fins and a fourth subgroup of fins that are disposed on opposing sides of the fins extending from the top end to the bottom end,
         wherein the third subgroup and the fourth subgroup each includes at least one fin that runs along one of either the first side edge and the second side edge,
      wherein the fins of the third subgroup of fins and fourth subgroup of fins only partially extend from the bottom end to an ending point before the top end; and
      the one or more electrical devices attached at a backside of the heatsink.

11. The cooling device of claim 10, wherein the first subgroup of fins and the second subgroup of fins have a same number of fins.

12. The cooling device of claim 10, wherein a length of a fin in the third subgroup of fins is dependent on a distance to a side of the heatsink.

13. The cooling device of claim 12, wherein the length increases or decreases depending on the distance to the side of the heatsink.

14. The cooling device of claim 10, wherein an end of one or more fins in the first group of fins is aligned with a corresponding one of one or more corresponding fins in the second group of fins.

15. The cooling device of claim 14, wherein the one or more fins in the first group of fins and the one or more corresponding fins in the second group of fins are formed as common fins.

16. The cooling device of claim 14, wherein there is a gap between the one or more fins in the first group of fins and the one or more corresponding fins in the second group of fins.

17. The cooling device of claim 10, wherein one or more fins in the first group of fins are non-aligned with one or more corresponding fins in the second group of fins.

18. The cooling device of claim 10, wherein the second planar direction is angled in relation to the first planar direction with an angle having a value within a range from 0 to 90 degrees.

* * * * *

UNITED STATES PATENT AND TRADEMARK OFFICE
CERTIFICATE OF CORRECTION

PATENT NO. : 12,114,467 B2
APPLICATION NO. : 17/871660
DATED : October 8, 2024
INVENTOR(S) : Kallmark et al.

Page 1 of 1

It is certified that error appears in the above-identified patent and that said Letters Patent is hereby corrected as shown below:

In the Claims

Claim 1: Column 9, Line 20: "planar direction of the frontside; and," should read as -- planar direction of the frontside, --.

Claim 5: Column 9, Line 54: "one or more fins in the first group of fins are is aligned with" should read as -- one or more fins in the first group of fins is aligned with --.

Signed and Sealed this
Twentieth Day of May, 2025

Coke Morgan Stewart
*Acting Director of the United States Patent and Trademark Office*